United States Patent
Muranaka (10) Patent No.: US 11,218,180 B2
(45) Date of Patent: Jan. 4, 2022

(54) FILTER AND MULTIPLEXER

(71) Applicant: Murata Manufacturing Co., Ltd., Nagaokakyo (JP)

(72) Inventor: Hiroshi Muranaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/105,684

(22) Filed: Nov. 27, 2020

(65) Prior Publication Data
US 2021/0083700 A1 Mar. 18, 2021

Related U.S. Application Data

(63) Continuation of application No. PCT/JP2019/024328, filed on Jun. 19, 2019.

(30) Foreign Application Priority Data

Jun. 21, 2018 (JP) .............................. JP2018-117963

(51) Int. Cl.
*H04L 5/12* (2006.01)
*H04L 23/02* (2006.01)
(Continued)

(52) U.S. Cl.
CPC ............ *H04B 1/0483* (2013.01); *H04B 1/006* (2013.01); *H04B 1/0035* (2013.01)

(58) Field of Classification Search
CPC .... H04B 1/0483; H04B 1/0035; H04B 1/006; H04B 1/52; H03H 9/54; H03H 9/64; H03H 9/72; H03H 9/542
(Continued)

(56) References Cited

U.S. PATENT DOCUMENTS

| 6,525,624 B1* | 2/2003 | Hikita ................. H03H 7/0161 333/133 |
| 2006/0091977 A1 | 5/2006 | Inoue et al. |

(Continued)

FOREIGN PATENT DOCUMENTS

| JP | 2006-135447 A | 5/2006 |
| JP | 2010-192974 A | 9/2010 |

(Continued)

OTHER PUBLICATIONS

Official Communication issued in International Patent Application No. PCT/JP2019/024328, dated Sep. 3, 2019.

*Primary Examiner* — Tanmay K Shah
(74) *Attorney, Agent, or Firm* — Keating & Bennett, LLP (57) ABSTRACT

A transmission filter includes a transmission filter circuit and an additional circuit. The transmission filter circuit defines a first signal path connecting a first terminal and a second terminal. The additional circuit is connected to a first node located between the first terminal and the transmission filter circuit on the first signal path and a second node located between the second terminal and the transmission filter circuit on the first signal path and defines a second signal path connecting the first node and the second node. The additional circuit includes, on the second signal path, a resonator group, a capacitive element, and an inductance element. The inductance element is electromagnetically coupled to the transmission filter circuit.

14 Claims, 6 Drawing Sheets

(51) Int. Cl.
*H04B 1/04* (2006.01)
*H04B 1/00* (2006.01)

(58) Field of Classification Search
USPC .......................................................... 375/262
See application file for complete search history.

(56) References Cited

U.S. PATENT DOCUMENTS

| | | | |
|---|---|---|---|
| 2012/0182087 A1* | 7/2012 | Ye | H03H 9/0571 |
| | | | 333/133 |
| 2013/0113576 A1 | 5/2013 | Inoue et al. | |
| 2014/0113571 A1 | 4/2014 | Fujiwara et al. | |
| 2015/0365069 A1* | 12/2015 | Durner | H03H 9/605 |
| | | | 333/131 |
| 2017/0099043 A1* | 4/2017 | Goto | H03H 9/6436 |
| 2017/0366166 A1* | 12/2017 | Hey-Shipton | H03H 9/6483 |
| 2018/0123620 A1 | 3/2018 | Ueno | |
| 2019/0089329 A1 | 3/2019 | Konaka | |
| 2019/0260351 A1* | 8/2019 | Itou | H03H 9/64 |
| 2019/0319772 A1* | 10/2019 | Ando | H03H 9/54 |
| 2020/0259481 A1* | 8/2020 | Kimura | H03H 9/72 |

FOREIGN PATENT DOCUMENTS

| | | |
|---|---|---|
| JP | 2014-171210 A | 9/2014 |
| JP | 2016-220263 A | 12/2016 |
| JP | 2017-092945 A | 5/2017 |
| WO | 2017/006866 A1 | 1/2017 |
| WO | 2017/199543 A1 | 11/2017 |

\* cited by examiner

FILTER AND MULTIPLEXER

CROSS REFERENCE TO RELATED APPLICATIONS

This application claims the benefit of priority to Japanese Patent Application No. 2018-117963 filed on Jun. 21, 2018 and is a Continuation Application of PCT Application No. PCT/JP2019/024328 filed on Jun. 19, 2019. The entire contents of each application are hereby incorporated herein by reference.

BACKGROUND OF THE INVENTION

1. Field of the Invention

The present invention relates to a filter and a multiplexer each including an additional circuit.

2. Description of the Related Art

In acoustic wave filters and multiplexers including acoustic wave filters, the improvement of attenuation characteristics of a filter and the improvement of isolation characteristics between filters are required. It has been known that for such an improvement, an additional circuit, which is connected in parallel with a filter circuit and generates a signal opposite in phase to out-of-band signal components transmitted through the filter circuit, is used (see, for example, the cancellation circuit disclosed in Japanese Unexamined Patent Application Publication No. 2016-220263). The cancellation circuit disclosed in Japanese Unexamined Patent Application Publication No. 2016-220263 includes a longitudinally coupled resonator and a capacitor.

With the wider frequency band of a filter as a backdrop, phase adjustment is difficult to perform in a desired frequency band with a configuration in the related art. Sufficient attenuation characteristics and sufficient isolation characteristics are difficult to realize.

SUMMARY OF THE INVENTION

Preferred embodiments of the present invention improve attenuation characteristics and isolation characteristics in filters and multiplexers that include additional circuits.

A filter according to a preferred embodiment of the present invention includes a filter circuit defining a first signal path connecting a first terminal and a second terminal and an additional circuit that is connected to a first node located between the first terminal and the filter circuit on the first signal path and a second node located between the second terminal and the filter circuit on the first signal path. The additional circuit defines a second signal path connecting the first node and the second node. The additional circuit includes, on the second signal path, a resonator group including a plurality of IDT electrodes located adjacent to or in a vicinity of each other in an acoustic wave propagation direction, a capacitive element, and a first inductance element electromagnetically coupled to the filter circuit.

In the filter, the additional circuit is able to generate a signal that is in opposite or substantially opposite phase to a signal component of a frequency outside the pass band of the filter circuit. The additional circuit is able to adjust the phase of a signal according to an electromagnetic coupling between the first inductance element and the filter circuit and according to the adjustment performed by the resonator group (corresponding to a longitudinally coupled resonator in the related art). Therefore, the phase of a signal is able to be adjusted in a wider frequency band as compared with the related art, in which the phase of a signal is adjusted by only a longitudinally coupled resonator. Since a signal with which an out-of-band signal component is attenuated is able to be provided, the filter with improved attenuation characteristics is able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the respective preferred embodiments and drawings. The preferred embodiments to be described below represent a comprehensive or concrete example. The numerical values, shapes, materials, components, the arrangement and connection state of the components to be described in the following preferred embodiments are merely illustrative examples, and are not intended to limit the present invention.

A filter according to a preferred embodiment of the present invention and a multiplexer according to a preferred embodiment of the present invention will be described with respect to a duplexer that includes transmission filter and a reception filter and demultiplexes and multiplexes a transmission signal and a reception signal as an example. The transmission filter is an example of a filter according to a preferred embodiment of the present invention.

Figure 1:
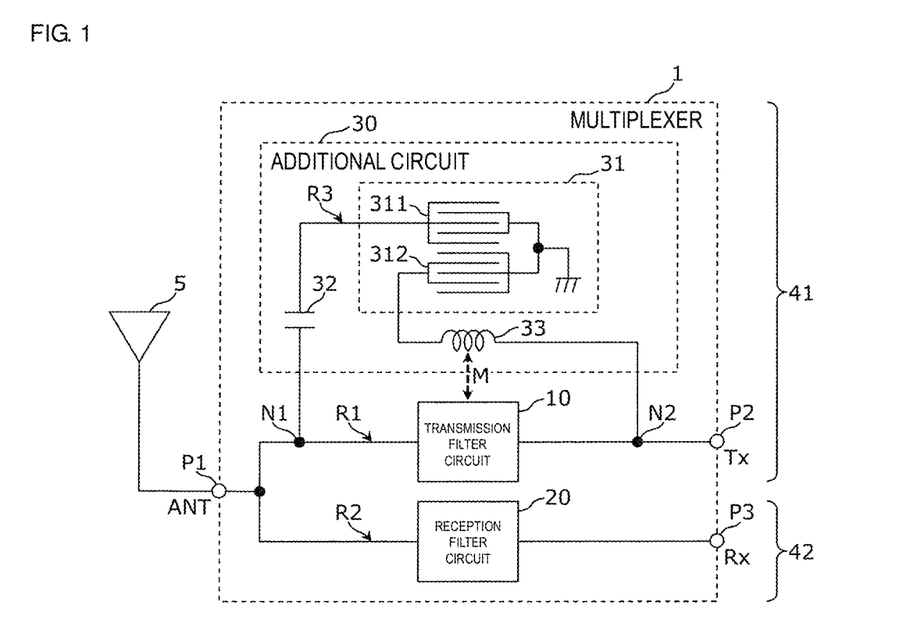
FIG. 1 is a circuit diagram illustrating a multiplexer according to a preferred embodiment of the present invention.

FIG. 1 is a circuit diagram illustrating a multiplexer according to a preferred embodiment of the present invention. As illustrated in FIG. 1, a multiplexer 1 includes terminals P1, P2, and P3, a transmission filter circuit 10, a reception filter circuit 20, and an additional circuit 30.

The terminals P1, P2, and P3 are an antenna terminal ANT, a transmission terminal Tx, and a reception terminal Rx, respectively. The terminal P1 is connected to an antenna 5.

The transmission filter circuit 10, a first end of which is connected to the terminal P1 and a second end of which is connected to the terminal P2, defines a signal path R1 connecting the terminals P1 and P2. The first end and the second end of the transmission filter circuit 10 may be directly connected to the terminals P1 and P2, respectively, or may be connected to the terminals P1 and P2 via other circuit elements (not illustrated).

The reception filter circuit 20, a first end of which is connected to the terminal P1 and a second end of which is connected to the terminal P3, defines a signal path R2 connecting the terminals P1 and P3. The first end and the second end of the reception filter circuit 20 may be directly connected to the terminals P1 and P3, respectively, or may be connected to the terminals P1 and P3 via other circuit elements (not illustrated).

The additional circuit 30 generates a signal that is in opposite or substantially opposite phase to a signal component in a target frequency band not included in the pass band (i.e., cancellation target signal component) in signals transmitted by the transmission filter circuit 10. A first end of the additional circuit 30 is connected to a node N1 between the terminal P1 and the transmission filter circuit 10 on the signal path R1, and a second end of the additional circuit 30 is connected to a node N2 between the terminal P2 and the transmission filter circuit 10 on the signal path R1. The additional circuit 30 defines a signal path R3 connecting the nodes N1 and N2.

The transmission filter circuit 10 and the additional circuit 30 define a transmission filter 41. The reception filter circuit 20 defines a reception filter 42. The transmission filter and the reception filter 42 demultiplex and multiplex a transmission signal and a reception signal.

The additional circuit 30 includes a resonator group 31, a capacitive element 32, and an inductance element 33 on the signal path R3.

The resonator group 31 includes inter digital transducer (IDT) electrodes 311 and 312 located adjacent to or in a vicinity of each other in an acoustic wave propagation direction. The resonator group 31 may include three or more IDT electrodes (not illustrated) located adjacent to or in a vicinity of each other in an acoustic wave propagation direction. The resonator group 31 may be a transversal filter that performs signal transmission by surface acoustic wave propagation between the IDT electrodes 311 and 312 or a longitudinally coupled resonator that performs signal transmission by surface acoustic wave coupling between the IDT electrodes 311 and 312.

The inductance element 33 is electromagnetically coupled to the transmission filter circuit 10 (represented by a dotted line M in FIG. 1). The electromagnetic coupling between the inductance element 33 and the transmission filter circuit 10 may be any one of or both of inductive coupling and capacitive coupling.

The resonator group 31 and the capacitive element 32 control the phase and amplitude of a signal passing through the additional circuit 30, respectively. The phase of a signal passing through the additional circuit 30 is further adjusted by the inductance element 33 electromagnetically coupled to the transmission filter circuit 10.

According to the structure and operation described above, the additional circuit 30 generates a signal (hereinafter referred to as a cancellation signal) that is in opposite or substantially opposite phase to a signal component in a target frequency band not included in the pass band in signals transmitted by the transmission filter circuit 10. When the cancellation signal is combined with the cancellation target signal component, the amplitude of a result of the combination of the cancellation signal and the cancellation target signal component is smaller than that of the cancellation target signal component. The cancellation signal is in opposite or substantially opposite phase to and is preferably of the same or substantially the same amplitude as the cancellation target signal component that has passed through the transmission filter circuit 10, for example.

The cancellation target signal component and the cancellation signal being in opposite or substantially opposite phase to each other means that the absolute value of the phase difference between them is greater than about 90° in the range of about −180° to about 180°. Accordingly, the cancellation target signal component and the cancellation signal have phase components in opposite or substantially opposite directions.

The cancellation signal is preferably of the same or substantially the same amplitude as the cancellation target signal component, but may be of the different amplitude, for example. When the amplitude of a result of the combination of the cancellation signal and the cancellation target signal component is smaller than that of the cancellation target signal component on the basis of the phase difference between them, attenuation characteristics are able to be improved.

The additional circuit 30 is able to adjust the phase of a cancellation signal by the adjustment performed by the inductance element 33 electromagnetically coupled to the transmission filter circuit 10 in addition to the adjustment performed by the resonator group 31. The phase of a cancellation signal is therefore able to be adjusted in a wider frequency band as compared with the phase of a cancellation signal being adjusted by only the resonator group 31. Since a cancellation signal with which a cancellation target signal component is significantly attenuated is able to be provided, the transmission filter 41 with improved attenuation characteristics is able to be provided.

The additional circuit 30 may include a delay line instead of the resonator group 31.

The multiplexer 1 will be described below with respect to the transmission filter circuit 10 and the reception filter circuit 20 as acoustic wave filter circuits including a plurality of acoustics wave resonators, as an example.

Figure 2:
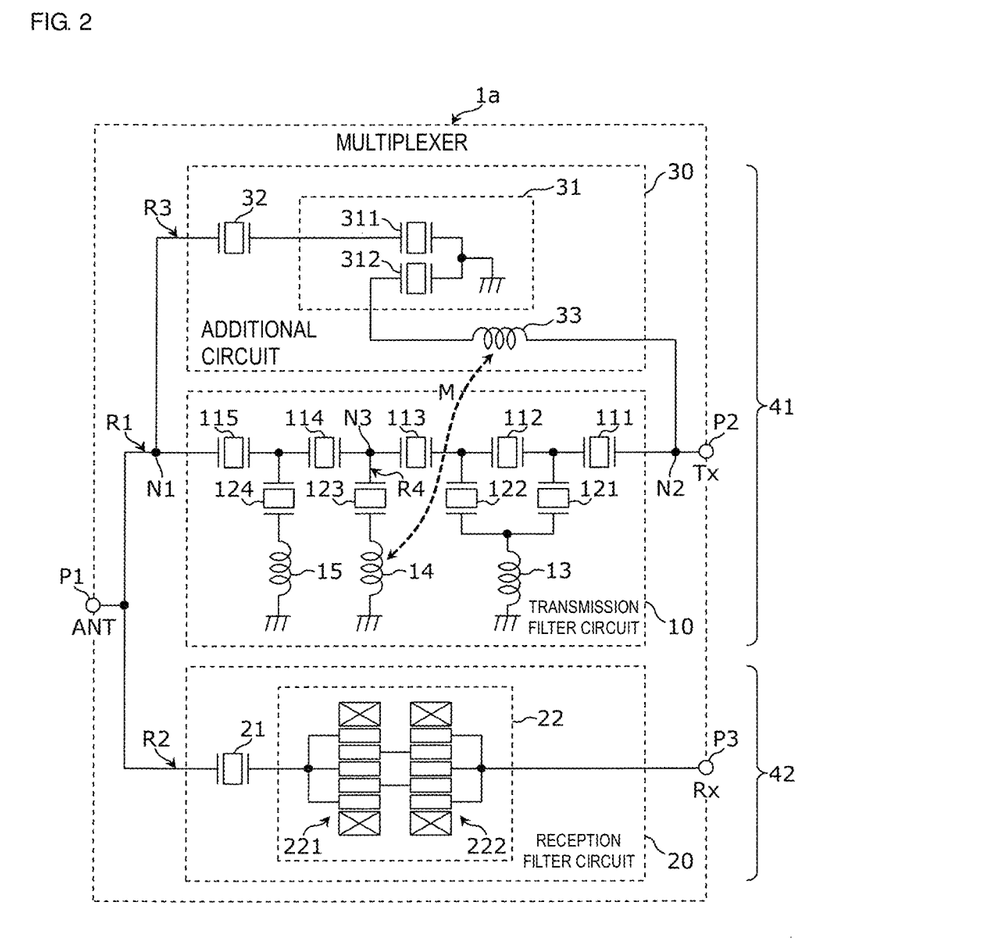
FIG. 2 is a circuit diagram illustrating a multiplexer according to a preferred embodiment of the present invention.

FIG. 2 is a circuit diagram illustrating a multiplexer 1a. In this drawing, internal features of the transmission filter circuit 10 and the reception filter circuit 20 are illustrated. In the multiplexer 1a in FIG. 2, the multiplexer 1 in FIG. 1 is provided as follows.

The transmission filter circuit 10 includes series arm resonators 111 to 115 provided on the signal path R1 and parallel arm resonators 121 to 124 and inductance elements 13 to 15 provided between the signal path R1 and the ground.

The inductance element 14 is electromagnetically coupled to the inductance element 33 in the additional circuit 30 (represented by a dotted line M in FIG. 2). The inductance element 14 is provided on a ground path R4 connecting a node N3 on the signal path R1 and the ground along with the parallel arm resonator 123.

The reception filter circuit 20 includes an acoustic wave resonator 21 and a resonator group 22 on the signal path R2. The resonator group 22 includes two longitudinally coupled resonators 221 and 222 connected in series with each other.

In the additional circuit 30, the capacitive element 32 is an acoustic wave resonator. The capacitance of an IDT electrode is provided as the capacitive element 32.

The transmission filter circuit 10 with the above structure is provided as an acoustic wave filter including the series arm resonators 111 to 115 and the parallel arm resonators 121 to 124. The inductance elements 13 to 15 may be provided in an acoustic wave filter. By electromagnetically coupling the inductance element 14 to the inductance element 33 in the additional circuit 30, the transmission filter 41 with improved attenuation characteristics is able to be provided without increasing the number of components.

The packaging structure of the multiplexer 1a illustrated in FIG. 2 will be described with respect to a module using a multilayer wiring board and a piezoelectric substrate as an example.

Figure 3:
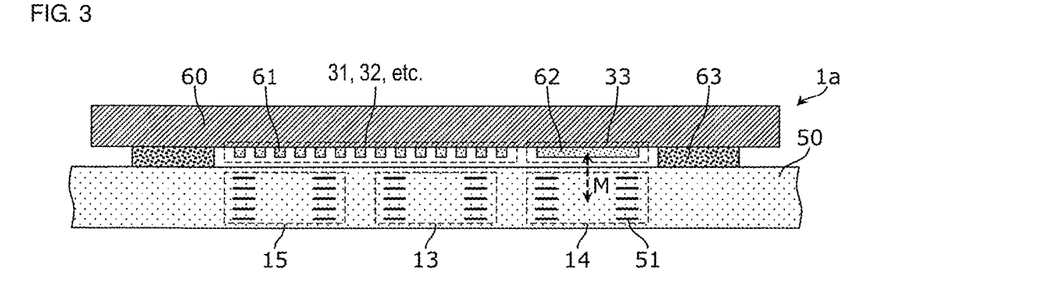
FIG. 3 is a side view of a multiplexer according to a preferred embodiment of the present invention which illustrates an example of packaging structure of the multiplexer.
Figure 4:
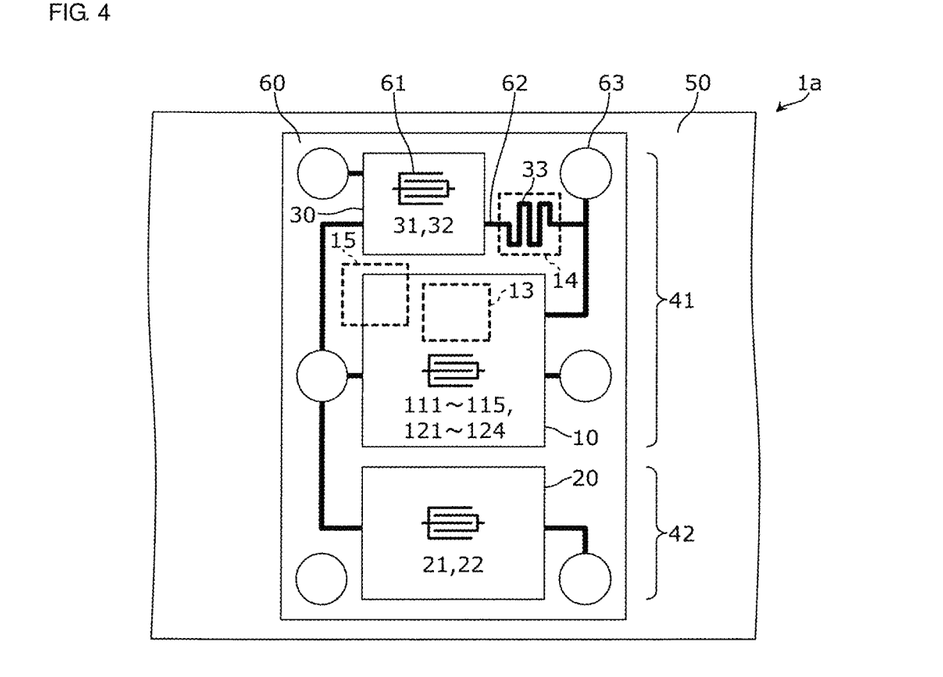
FIG. 4 is a plan view of a multiplexer according to a preferred embodiment of the present invention which illustrates an example of packaging structure of the multiplexer.

FIGS. 3 and 4 are side and plan views illustrating an example of a packaging structure of the multiplexer 1a, respectively. As illustrated in FIGS. 3 and 4, the multiplexer 1a includes a multilayer wiring board 50 and a piezoelectric substrate 60 provided on one main surface of (an upper main surface in FIG. 3) of the multilayer wiring board 50.

The multilayer wiring board 50 is a laminate of a plurality of substrates. A pattern conductor 51 is provided in the planes of the substrates and between the layers of the substrates. The substrates include, for example, a resin or ceramic material. The pattern conductor 51 includes, for example, a metallic material containing copper or silver.

The pattern conductor 51 is wound in a coil to define the inductance elements 13 to 15.

The piezoelectric substrate 60 includes, for example, a piezoelectric material such as single-crystal lithium tantalite or ceramic. On one main surface (a lower main surface in FIG. 3), an IDT electrode 61, a wiring electrode 62, and a connection electrode 63 are provided. The IDT electrode 61, the wiring electrode 62, and the connection electrode 63 include a metallic material containing at least one of, for example, copper, aluminum, and silver.

The IDT electrode 61 defines the series arm resonators 111 to 115 and the parallel arm resonators 121 to 124 in the transmission filter circuit 10, the acoustic wave resonator 21 and the resonator group 22 in the reception filter circuit 20, and the resonator group 31 and the capacitive element 32 in the additional circuit 30.

The wiring electrode 62 connects the resonators defined by the IDT electrode 61 and connects the resonator defined by the IDT electrode 61 and the connection electrode 63. A portion of the wiring electrode 62 defines the inductance element 33. For example, the portion of the wiring electrode 62 defining the inductance element 33 may have a meandering shape.

The connection electrode 63 is connected to a pattern conductor (not illustrated) in the multilayer wiring board 50 via a conductive joining material, for example, solder.

The circuit in the multiplexer 1a illustrated in FIG. 2 is provided by the above packaging structure. The multiplexer 1a is implemented as a module including the multilayer wiring board 50 and the piezoelectric substrate 60.

As illustrated in FIG. 3, when the multilayer wiring board 50 and the piezoelectric substrate 60 are viewed in plan, the inductance element 33 defined by a portion of the wiring electrode 62 and the inductance element 14 are located in a region where they at least partly overlap each other. Since the inductance elements 33 and 14 therefore have respective portions facing each other, they are electromagnetically coupled with the degree of coupling based on their respective locations at the substrates (represented by a dotted line M in FIG. 3).

Accordingly, by implementing the multiplexer 1a, the reduction in size and cost of the transmission filter 41 with improved attenuation characteristics is able to be provided without including additional components, for example, chip inductors as the inductance elements 14 and 33.

The results of simulations performed to determine the improvement of attenuation characteristics due to the coupling between inductance elements will be described below. In the simulations, the multiplexer 1a (FIG. 2) in which the appropriate degree of coupling between the inductance elements 33 and 14 was set and a multiplexer in which there was no coupling between the inductance elements 33 and 14 were provided as Example and a comparative example, respectively.

Figure 5:
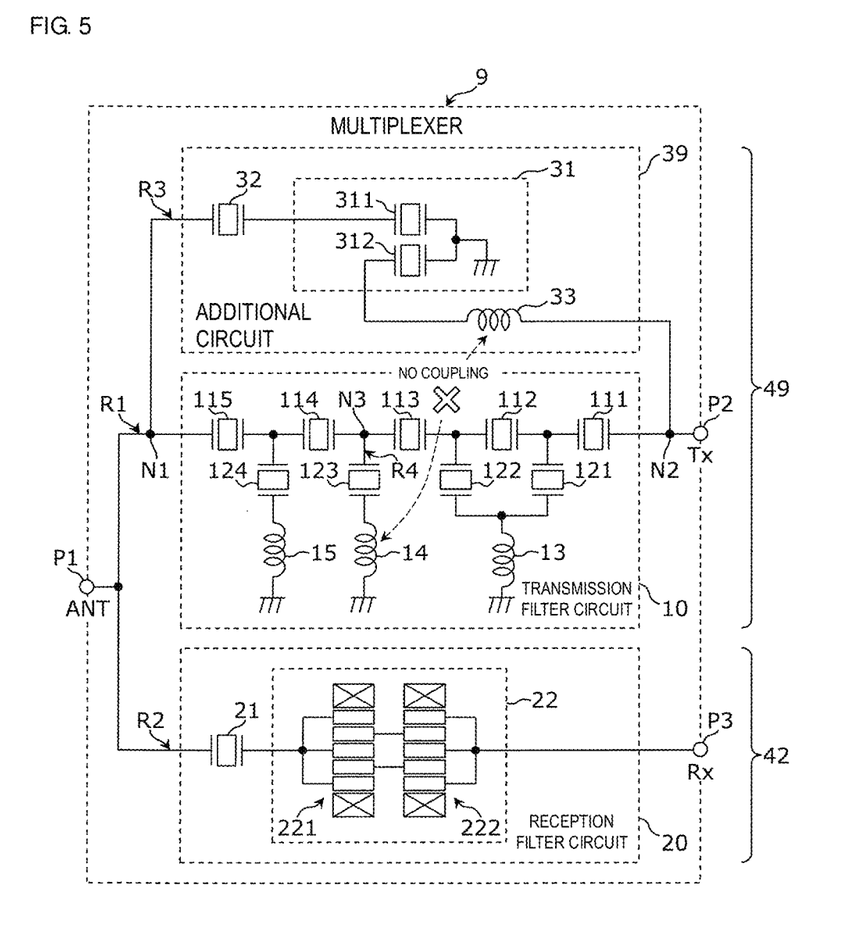
FIG. 5 is a circuit diagram illustrating a multiplexer that is a comparative example.

FIG. 5 is a circuit diagram illustrating a multiplexer 9 that is a comparative example. The multiplexer 9 has the same or similar circuitry as the multiplexer 1a in FIG. 2 and differs from the multiplexer 1a in that there is no coupling between the inductance elements 33 and 14. For the sake of distinction, the additional circuit 30 and the transmission filter 41 in the multiplexer 1a are referred to as an additional circuit 39 and a transmission filter 49 in the multiplexer 9, respectively.

Although a multiplexer not including the inductance element 33 was considered as another comparative example, there was no difference between the characteristics of the multiplexer and the multiplexer 9. Accordingly, in the following description, the multiplexer 9 will be used as a representative comparative example.

The pass bands of the transmission filter 41 and the reception filter 42 were set to the transmission band of about 718 MHz to about 748 MHz and the reception band of about 773 MHz to about 803 MHz, respectively in the band B28B in Long Term Evolution (LTE®). The frequency band of a cancellation target signal component in the transmission filter 41 (hereinafter also referred to as cancellation band) was set to the reception band of about 773 MHz to about 803 MHz in the band B28B.

Figure 6:
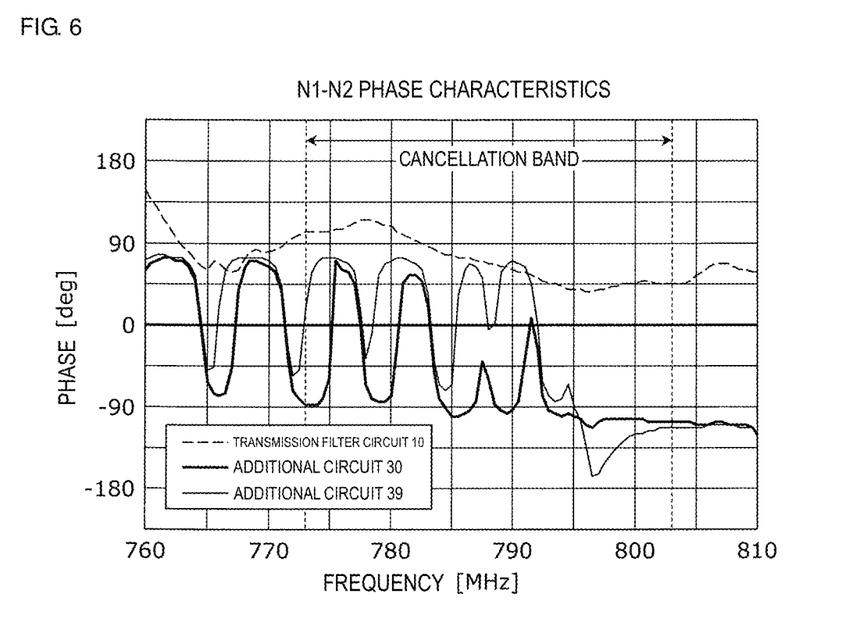
FIG. 6 is a graph illustrating phase characteristics of a transmission filter circuit and an additional circuit according to a preferred embodiment of the present invention.

FIG. 6 is a graph representing phase characteristics of the transmission filter circuit 10 and the additional circuits 30 and 39. FIG. 6 illustrates the amount of phase shift appearing at a signal that has passed through any one of the transmission filter circuit 10 and the additional circuits 30 and 39 between the nodes N1 and N2 (hereinafter abbreviated as the phase shift of the transmission filter circuit 10, the additional circuit 30, or the additional circuit 39).

As described above, a cancellation signal needs to be in opposite or substantially opposite phase to a cancellation target signal component to attenuate the cancellation target signal component (that is, the absolute value of the phase difference between them is greater than about 90° in the range of about −180° to about 180°).

As illustrated in FIG. 6, the phase of the additional circuit 30 (heavy line) is opposite or substantially opposite to the phase of the transmission filter circuit 10 (broken line) in a larger portion of the cancellation band as compared with the phase of the additional circuit 39 (thin line). Accordingly, a cancellation signal generated by the additional circuit 30 significantly attenuates a cancellation target signal component as compared with a signal generated by the additional circuit 39. Therefore, the attenuation characteristics of the transmission filter 41 are improved by a cancellation signal generated in the additional circuit 30.

Figure 7:
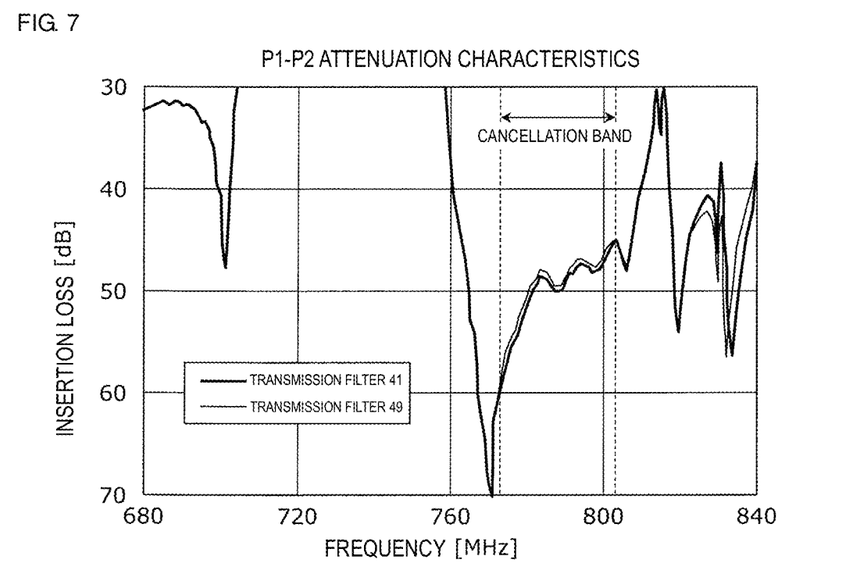
FIG. 7 is a graph illustrating attenuation characteristics of a transmission filter according to a preferred embodiment of the present invention.

FIG. 7 is a graph illustrating attenuation characteristics of the transmission filters 41 and 49. In FIG. 7, the insertion loss between the terminals P1 and P2 is illustrated.

As shown in FIG. 7, the insertion loss of the transmission filter 41 is higher than the insertion loss of the transmission filter 49 in the cancellation band, and the attenuation characteristics of the transmission filter 41 in the cancellation band are improved compared to the attenuation characteristics of the transmission filter 49. The isolation characteristics of the multiplexer 1a are improved because of the improved attenuation characteristics of the transmission filter 41.

Figure 8:
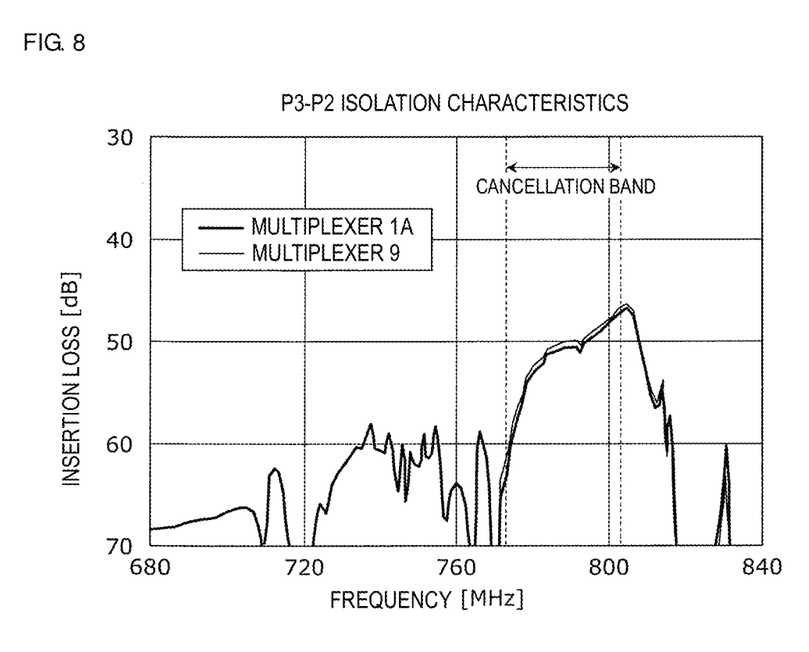
FIG. 8 is a graph illustrating isolation characteristics of a multiplexer according to a preferred embodiment of the present invention.

FIG. 8 is a graph illustrating isolation characteristics of the multiplexers 1a and 9. In FIG. 8, the insertion loss between the terminals P3 and P2 is illustrated.

As shown in FIG. 8, the insertion loss of the multiplexer 1a is higher than the insertion loss of the multiplexer 9 in the cancellation band, and the isolation characteristics of the multiplexer 1a in the cancellation band are improved compared to the isolation characteristics of the multiplexer 9.

Thus, the attenuation characteristics and isolation characteristics of the multiplexer 1a in which the appropriate degree of coupling between the inductance elements 14 and 33 is set are improved as compared with the multiplexer 9 in which there is no coupling between the inductance elements 14 and 33.

Although a filter according to a preferred embodiment of the present invention and a multiplexer according to preferred embodiment of the present invention have been described, the present invention is not limited to each preferred embodiment. Various modifications to the preferred embodiments that can be conceived by those skilled in the art, and additional preferred embodiments provided by combining elements and/or features of different preferred embodiments without departing from the teachings of the present invention may be included in the scope of the present invention.

In the above preferred embodiments, the present invention has been described with respect to a transmission filter in a duplexer. However, preferred embodiments of the present invention can be similarly applied to a reception filter in a duplexer or a single filter. Preferred embodiments of the present invention may be applied to a filter in a diplexer, a triplexer, or a quadplexer that demultiplexes and multiplexes a plurality of signals in different frequency bands.

An element in a filter circuit which is electromagnetically coupled to an inductance element in an additional circuit is not particularly limited. For example, the inductance element 33 may be electromagnetically coupled to the inductance element 13 or 15 in FIG. 2. Alternatively, when the transmission filter circuit 10 includes an inductance element on the signal path R1, the inductance element 33 may be electromagnetically coupled to the inductance element.

A filter according to a preferred embodiment of the present invention includes a filter circuit defining a first signal path connecting a first terminal and a second terminal and an additional circuit that is connected to a first node located between the first terminal and the filter circuit on the first signal path and a second node located between the second terminal and the filter circuit on the first signal path and defines a second signal path connecting the first node and the second node. The additional circuit includes on the second signal path, a resonator group including a plurality of IDT electrodes located adjacent to or in a vicinity of each other in an acoustic wave propagation direction, a capacitive element, and a first inductance element electromagnetically coupled to the filter circuit.

Accordingly, the additional circuit is able to adjust the phase of a cancellation signal by electromagnetic coupling between the first inductance element and the filter circuit in addition to the adjustment performed by the resonator group. Therefore, the phase of a cancellation signal is able to be adjusted in a wider frequency band as compared with the case where the phase of a cancellation signal is adjusted by only the resonator group. Since a cancellation signal with which an out-of-band signal component is significantly attenuated is able to be provided, the filter with improved attenuation characteristics is able to be provided.

The filter circuit may include series arm resonators provided on the signal path and a parallel arm resonator and a second inductance element which are provided on a ground path connecting a third node on the signal path and a ground. The first inductance element and the second inductance element may be electromagnetically coupled to each other.

Accordingly, the filter circuit may be provided as an acoustic wave filter including the series arm resonators and the parallel arm resonator. In an acoustic wave filter for practical use, an inductance element to adjust characteristics may be provided on a ground path. By electromagnetically coupling the inductance element to the first inductance element in the additional circuit as the second inductance element, the filter with improved attenuation characteristics is able to be provided without significantly increasing the number of components.

The filter may further include a multilayer wiring board where a pattern conductor is provided and a piezoelectric substrate which is provided on one main surface of the multilayer wiring board and at which an IDT electrode and a wiring electrode are provided. The resonator group and the capacitive element may be defined by the IDT electrode. The first inductance element may be defined by the wiring electrode. The second inductance element may be defined by the pattern conductor. The first inductance element and the second inductance element may be located in a region where the first inductance element and the second inductance element at least partly overlap each other when the multilayer wiring board and the piezoelectric substrate are viewed in plan.

Accordingly, the first inductance element defined by the wiring electrode and the second inductance element defined by the pattern conductor are able to be electromagnetically coupled to each other with the degree of coupling based on the locations of the first and second inductance elements at the substrates. Accordingly, the reduction in size and cost of the filter with improved attenuation characteristics is able to be provided without using additional components, for example, chip inductors, as the first inductance element and the second inductance element.

A multiplexer according to a preferred embodiment of the present invention includes a first filter and a second filter, first ends of which are connected to each other. At least one of the first filter and the second filter is the above-described filter.

According to the above-described filter with improved attenuation characteristics, a multiplexer with improved isolation characteristics is able to be provided.

The preferred embodiments of the present invention are able to be widely applied to communication devices, for example, cellular phones, as a filter and a multiplexer each including an additional circuit.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter comprising:
a filter circuit defining a first signal path connecting a first terminal and a second terminal; and
an additional circuit that is connected to a first node located between the first terminal and the filter circuit on the first signal path and a second node located between the second terminal and the filter circuit on the first signal path; wherein
the additional circuit defines a second signal path connecting the first node and the second node; and
the additional circuit includes, on the second signal path, a resonator group including a plurality of IDT electrodes located adjacent to or in a vicinity of each other in an acoustic wave propagation direction, a capacitive element, and a first inductance element electromagnetically coupled to the filter circuit.

2. The filter according to claim 1, wherein the additional circuit generates a signal that is in opposite or substantially opposite phase to a signal component of a frequency outside a pass band of the filter circuit.

3. The filter according to claim 1, wherein
the filter circuit includes series arm resonators provided on the first signal path, and a parallel arm resonator and a second inductance element which are provided on a ground path connecting a third node on the first signal path and a ground; and
the first inductance element and the second inductance element are electromagnetically coupled to each other.

4. A filter comprising:
a filter circuit defining a first signal path connecting a first terminal and a second terminal; and
an additional circuit that is connected to a first node located between the first terminal and the filter circuit on the first signal path and a second node located between the second terminal and the filter circuit on the first signal path; wherein
the additional circuit defines a second signal path connecting the first node and the second node;
the additional circuit includes, on the second signal path:
a resonator group including a plurality of inter digital transducer (IDT) electrodes located adjacent to or in a vicinity of each other in an acoustic wave propagation direction;
a capacitive element;
a multilayer wiring board where a pattern conductor is provided; and
a piezoelectric substrate which is provided on one main surface of the multilayer wiring board and at which the plurality of IDT electrodes and a wiring electrode are provided;
the resonator group and the capacitive element are defined by the plurality of IDT electrodes;
the first inductance element is defined by the wiring electrode;
the second inductance element is defined by the pattern conductor; and
the first inductance element and the second inductance element are located in a region where the first inductance element and the second inductance element at least partly overlap each other when the multilayer wiring board and the piezoelectric substrate are viewed in plan.

5. A multiplexer comprising:
a first filter; and
a second filter, first ends of the first filter and the second filter being connected to each other, wherein
at least one of the first filter and the second filter is the filter according to claim 1.

6. A multiplexer comprising:
a first filter; and
a second filter, first ends of the first filter and the second filter being connected to each other; wherein
at least one of the first filter and the second filter is the filter according to claim 4.

7. A multiplexer, comprising:
a multilayer wiring board;
a piezoelectric substrate;
a connection electrode that connects the multilayer wiring board to the piezoelectric substrate;
a pattern conductor that is provided in the multilayer wiring board and that defines at least one first inductor;
a plurality of inter digital transducer (IDT) electrodes provided on a surface of the piezoelectric substrate that faces the multilayer wiring board;
a wiring electrode that is provided on the surface of the piezoelectric substrate that faces the multilayer wiring board and that defines at least one second inductor.

8. The multiplexer according to claim 7, wherein the plurality of IDT electrodes define at least one series arm resonator and at least one parallel arm resonator.

9. The multiplexer according to claim 7, wherein the plurality of IDT electrodes define a resonator of a transmission filter and a resonator of a reception filter.

10. The multiplexer according to claim 7, wherein
the plurality of IDT electrodes define a plurality of resonators; and
the plurality of resonators are connected by the wiring electrode.

11. The multiplexer according to claim 7, wherein the plurality of IDT electrodes define a capacitive element.

12. The filter according to claim 1, wherein the capacitive element is an acoustic wave resonator.

13. The filter according to claim 1, wherein the resonator group is a transversal filter that performs signal transmission by surface acoustic wave propagation or a longitudinally coupled resonator that performs signal transmission by surface acoustic wave coupling.

14. The filter according to claim 1, wherein the additional circuit includes a delay line.

* * * * *